(12) United States Patent
Lv et al.

(10) Patent No.: US 10,586,871 B2
(45) Date of Patent: Mar. 10, 2020

(54) THIN FILM TRANSISTOR, ARRAY SUBSTRATE, DISPLAY PANEL AND DISPLAY DEVICE

(71) Applicants: Boe Technology Group Co., Ltd., Beijing (CN); Beijing Boe Optoelectronics Technology Co., Ltd., Beijing (CN)

(72) Inventors: Zhenhua Lv, Beijing (CN); Zhiying Bao, Beijing (CN); Shijun Wang, Beijing (CN); Yong Zhang, Beijing (CN); Wenjun Xiao, Beijing (CN); Jingbo Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/220,717

(22) Filed: Jul. 27, 2016

(65) Prior Publication Data
US 2017/0194507 A1    Jul. 6, 2017

(51) Int. Cl.
*H01L 29/786* (2006.01)
*G02F 1/1368* (2006.01)
*H01L 27/12* (2006.01)

(52) U.S. Cl.
CPC ...... *H01L 29/78618* (2013.01); *H01L 27/124* (2013.01); *H01L 29/78696* (2013.01)

(58) Field of Classification Search
CPC ............ H01L 27/1222; H01L 27/124; H01L 27/1296; H01L 27/1288; H01L 27/127; H01L 29/78618; H01L 29/78624; H01L 29/78696; G02F 1/134309
See application file for complete search history.

(56) References Cited

U.S. PATENT DOCUMENTS

| 5,877,512 A | 3/1999 | Kim |
| 6,274,684 B1 | 8/2001 | Lee et al. |
| 6,274,884 B1 * | 8/2001 | Lee ............ G02F 1/1368 257/57 |
| 2017/0168332 A1 * | 6/2017 | Jeon ............ G02F 1/134309 |

FOREIGN PATENT DOCUMENTS

CN    104465673 A    3/2015

OTHER PUBLICATIONS

Second Office Action for Chinese Patent Application No. 201610005838.9 dated Jun. 14, 2018.
First Office Action for Chinese Patent Application No. 201610005638.9 dated Dec. 29, 2017.

* cited by examiner

*Primary Examiner* — Hoang-Quan T Ho
*Assistant Examiner* — Scott Stowe
(74) *Attorney, Agent, or Firm* — Calfee, Halter & Griswold LLP

(57) ABSTRACT

The present disclosure provides a thin film transistor, an array substrate, a display panel and a display device. The thin film transistor comprises a gate layer, a source and a drain located on the gate layer, and an active layer located on the source and the drain. The active layer is electrically connected to the source and the drain. The active layer comprises two sides arranged in parallel, and each side forms an acute angle of 45° with a face of the drain facing the source.

14 Claims, 5 Drawing Sheets

THIN FILM TRANSISTOR, ARRAY SUBSTRATE, DISPLAY PANEL AND DISPLAY DEVICE

RELATED APPLICATIONS

The present application claims the benefit of Chinese Patent Application No. 201610005838.9, filed on Jan. 5, 2016, the entire disclosure of which is incorporated herein by reference.

FIELD

The present disclosure relates to the field of display technologies, and particularly to a thin film transistor, an array substrate, a display panel and a display device.

BACKGROUND

At the time of manufacturing a thin film transistor, it is required to guarantee the precision of alignment between multilayer films. FIG. 1 is a structural schematic diagram of the prior art thin film transistor. The prior art thin film transistor mainly comprises a gate layer 01, a source 02 and a drain 03 located on the gate layer 01 and an active layer 04 located on the source 02 and the drain 03. Upon manufacture, it is required to guarantee the precision of alignment between the gate layer 01, the source 02, the drain 03 and the active layer 04, so as to ensure that the ratio of width W (illustrated by a bold line in FIG. 1) to length of the channel formed upon electrifying is unchanged.

However, at the time of manufacturing the prior art thin film transistor, it is difficult to guarantee the precision of alignment between the gate layer, the source, the drain and the active layer. When there is alignment deviation between the source, drain and the active layer, the width W of the channel will change such that the ratio of width to length of the channel will be changed, thereby influencing the picture display effect of the display device.

SUMMARY

Embodiments of the present disclosure provide a thin film transistor, an array substrate, a display panel and a display device, which can at least partially alleviate or eliminate one or more of the above deficiencies in the prior art.

One aspect of the present disclosure provides a thin film transistor comprising a gate layer, a source and a drain located on the gate layer, and an active layer located on the source and the drain. The active layer is electrically connected to the source and the drain. The active layer comprises two sides arranged in parallel, and each of the sides forms an acute angle of 45° with a face of the drain facing the source.

In the thin film transistor provided by the present disclosure, the shape of the active layer is changed such that the active layer comprises two sides arranged in parallel and each of the sides forms an acute angle of 45° with respect to a face of the drain facing the source. Consequently, even in the case that there is alignment deviation between the active layer and the source and/or drain, after the thin film transistor is electrified, the width of the channel formed between the active layer and the source and drain is not changed, thus the ratio of width to length of the channel is kept unchanged, thereby improving the display effect of the display device.

In some alternative embodiments, the source comprises a major portion, a first extension portion extending from the major portion to the drain, a second extension portion extending from the first extension portion to the direction away from the drain, and a third extension portion extending from the major portion to the direction away from the drain. The extending direction of the first extension portion is perpendicular to those of the second extension portion and the third extension portion. The arrangement of the first extension portion, the second extension portion and the third extension portion enables the capacitance at the position where the gate overlaps the source to be unchanged even in the event that there is alignment deviation between the active layer and the source and/or drain, thereby reducing flicker in the displayed picture of the display device.

In some alternative embodiments, the drain comprises a first main body arranged in parallel with the second extension portion, and a second main body extending from the first main body to the source. The second main body and the first main body are perpendicular to each other. The first extension portion and the second extension portion are symmetrical to each other with respect to an angular bisector of an angle at the position where the first extension portion joins the second extension portion, and the first main body and the second main body are symmetrical to each other with respect to the angular bisector.

In some alternative embodiments, the active layer further comprises a first connecting side and a second connecting side for connecting the two sides arranged in parallel. Collision-preventing chamfers are formed at positions where the second connecting side connects the two sides arranged in parallel. The arrangement of the collision-preventing chamfers at the positions where the second connecting side connects the two sides arranged in parallel can prevent occurrence of the phenomenon that the active layer extends beyond the drain when there is alignment deviation between the active layer and the source and drain.

In some alternative embodiments, collision-preventing chamfers are formed at positions where the first connecting side connects the two sides arranged in parallel, which can prevent occurrence of the phenomenon that the active layer extends beyond the source when there is alignment deviation between the active layer and the source and drain.

In some alternative embodiments, the portion of the first connecting side which corresponds to the position where the first extension portion joins the second extension portion is provided with a collision-preventing mouth protruding towards the second connecting side.

In some alternative embodiments, the source and the drain are arranged in the same layer.

Another aspect of the present disclosure further provides an array substrate comprising any thin film transistor described above. Since the above thin film transistor can ensure the ratio of width to length of the channel formed upon electrifying to be unchanged and thereby improve the display effect of the display device, the array substrate provided by the present disclosure can improve the display effect of the display device.

A further aspect of the present disclosure further provides a display panel comprising the above array substrate. Since the above array substrate can improve the display effect of the display device, the display panel provided by the present disclosure has good display effect.

Yet another aspect of the present disclosure further provides a display device comprising the above display panel. The display device has good display effect.

BRIEF DESCRIPTION OF DRAWINGS

The drawings described here are used for providing further understanding of the present disclosure, and constitute a part of the present disclosure. Illustrative embodiments of the present disclosure and explanations thereof are used for interpreting the present disclosure, but do not limit the present disclosure in an inappropriate manner. In the drawings.

DETAILED DESCRIPTION

Figure 1:
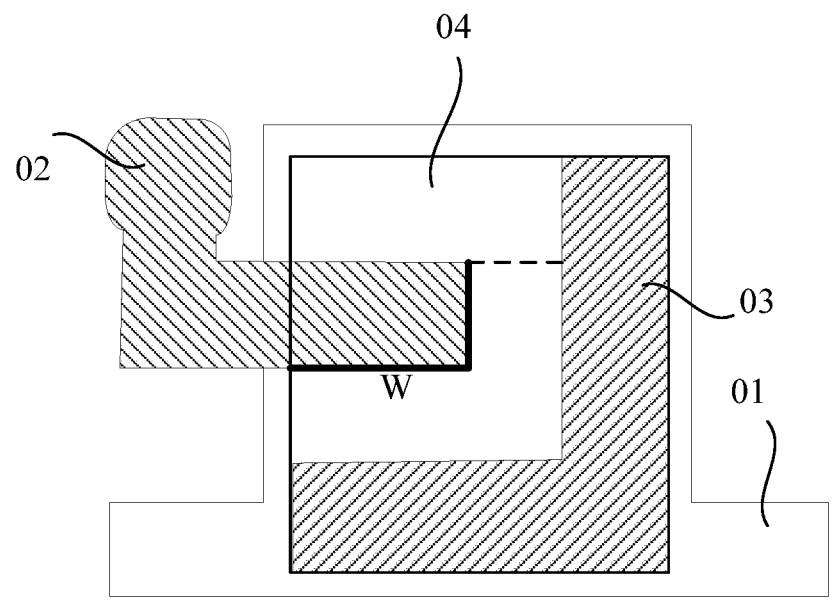
FIG. 1 is a structural schematic diagram of the prior art thin film transistor.

The technical solutions of embodiments of the present disclosure will be clearly and completely described below with reference to the drawings in the embodiments of the present disclosure. Obviously, the described embodiments are just part of the embodiments rather than all of them.

In the drawings, the following reference signs are used:

| | |
|---|---|
| 01-gate layer | 02-source |
| 03-drain | 04-active layer |
| 1-gate layer | 2-source |
| 21-first extension portion | 22-second extension portion |
| 23-third extension portion | 24-major portion |
| 3-drain | 31-first main body |
| 32-second main body | 4-active layer |
| 41-collision-preventing chamfer | 42-collision-preventing mouth |
| 5-angular bisector | |
| a, a1, b, b1, s, e, h and f represent a length; c represents an angle. | |

Figure 2:
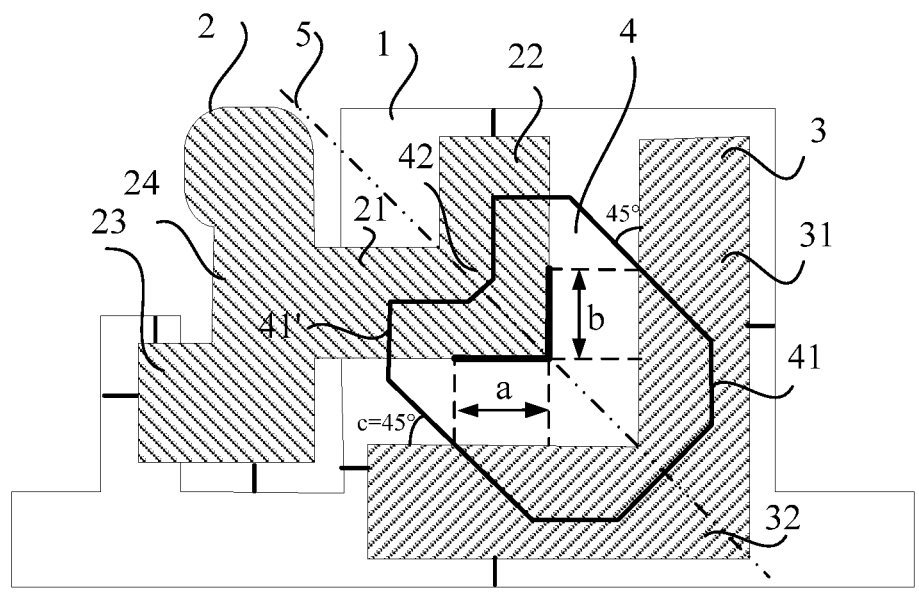
FIG. 2 is a structural schematic diagram of a thin film transistor provided by embodiments of the present disclosure.

FIG. 2 illustrates a structural schematic diagram of a thin film transistor provided by embodiments of the present disclosure. As shown in FIG. 2, the thin film transistor comprises a gate layer 1, a source 2 and a drain 3 located on the gate layer 1, and an active layer 4 located on the source 2 and the drain 3. The active layer 4 is electrically connected to the source 2 and the drain 3, and comprises two sides arranged in parallel. Each side forms an acute angle of 45° with a face of the drain 3 which faces the source 2.

In the thin film transistor provided by the present disclosure, the shape of the active layer 4 is changed such that the active layer 4 comprises two sides arranged in parallel and each side forms an acute angle of 45° with respect to a face of the drain 3 which faces the source 2. Consequently, even in the case that there is alignment deviation between the active layer 4 and the source 2 and/or drain 3, after the thin film transistor is electrified, the width of the channel formed between the active layer 4 and the source 2 and drain 3 is not changed, thus the ratio of width to length of the channel is kept unchanged, thereby improving the display effect of the display device.

As used herein, the width of the channel formed after electrifying the thin film transistor is defined as a sum of the lengths of opposite faces of the source 2 and the drain 3 in the corresponding region of the active layer 4, i.e. a+b as shown in FIG. 2.

FIGS. 3a-3d are structural schematic diagrams showing that the active layer 4 shifts with respect to the source 2 and the drain 3 in the thin film transistor provided by embodiments of the present disclosure. In FIGS. 3a-3d, the black solid lines represent the correct alignment position of the active layer 4, and the broken lines represent the position after the active layer 4 has shifted. Taking FIG. 3a as an example, the distance by which the active layer 4 shifts rightwards with respect to the correct position is s. When the active layer 4 does not shift, the width of the channel is a+b. When the active layer 4 shifts, a is decreased by a1 and b is increased by b1, thus the width of the channel becomes a−a1+b+b1. In the figure, $h/s = \sin c = \sin 45°$, then $$h = s \times \sin c = s \times \sin 45° \qquad (1);$$

$$a1 = h/\sin c = h/\sin 45° \qquad (2);$$

it can be obtained from the equations (1) and (2) that a1=s. Moreover, $e/s = \cos c = \cos 45°$, then $$e = s \times \cos c = s \times \cos 45° \qquad (3);$$

$$b1 = e/\sin c = \sin 45° \qquad (4);$$

it can be obtained from the equations (3) and (4) that $$b1 = s \times \frac{\cos 45°}{\sin 45°} = s.$$

Thus a1=b1. That is to say, after the active layer 4 has shifted rightwards by the distance s, the width of the channel is still a+b. Therefore, regardless of whether the active layer 4 shifts rightwards or not, the width of the channel is not changed. Since the length thereof is not changed either, the ratio of width to length of the channel is unchanged.

Figure 3A:
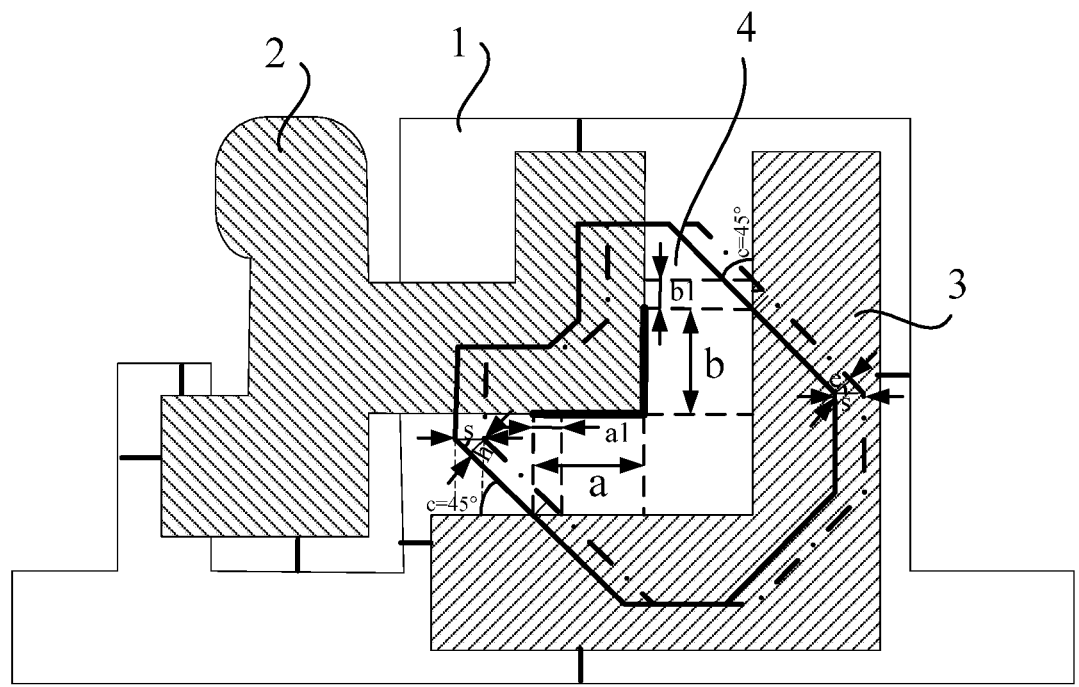
FIGS. 3a-3d are structural schematic diagrams showing that the active layer shifts with respect to the source and the drain in the thin film transistor provided by embodiments of the present disclosure.
Figure 3B:
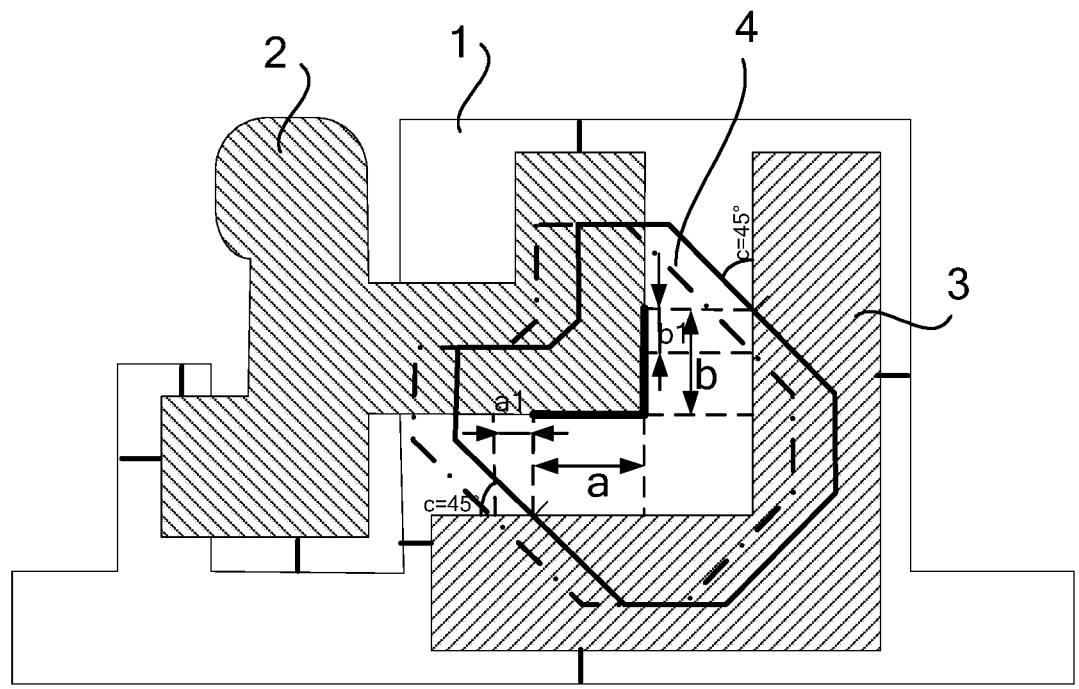
Figure 3C:
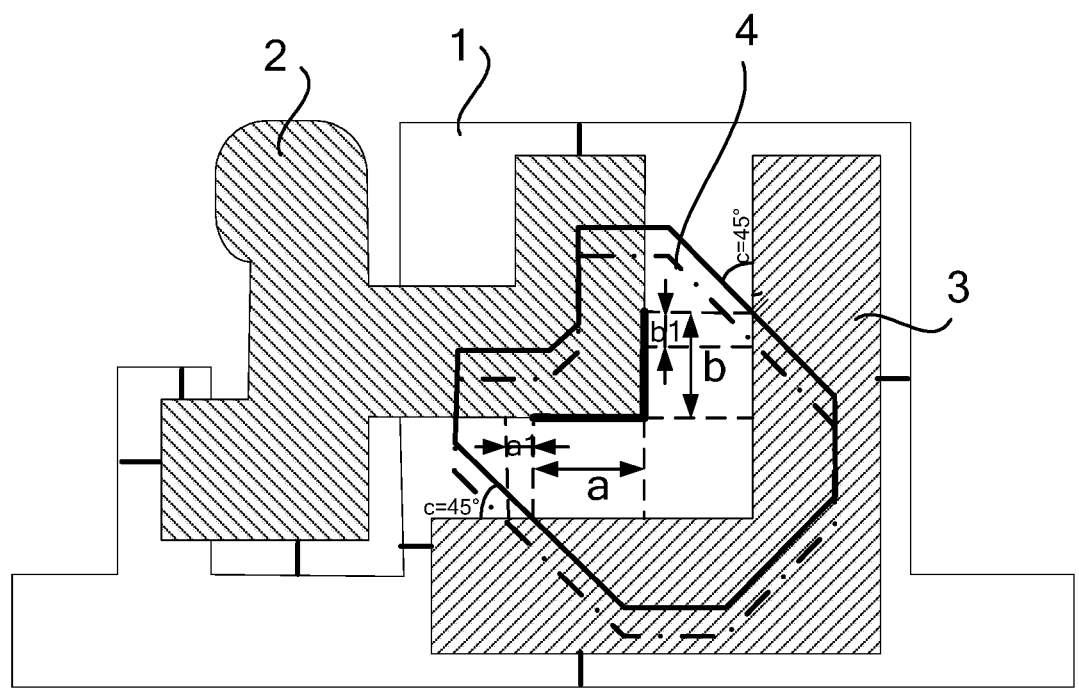
Figure 3D:
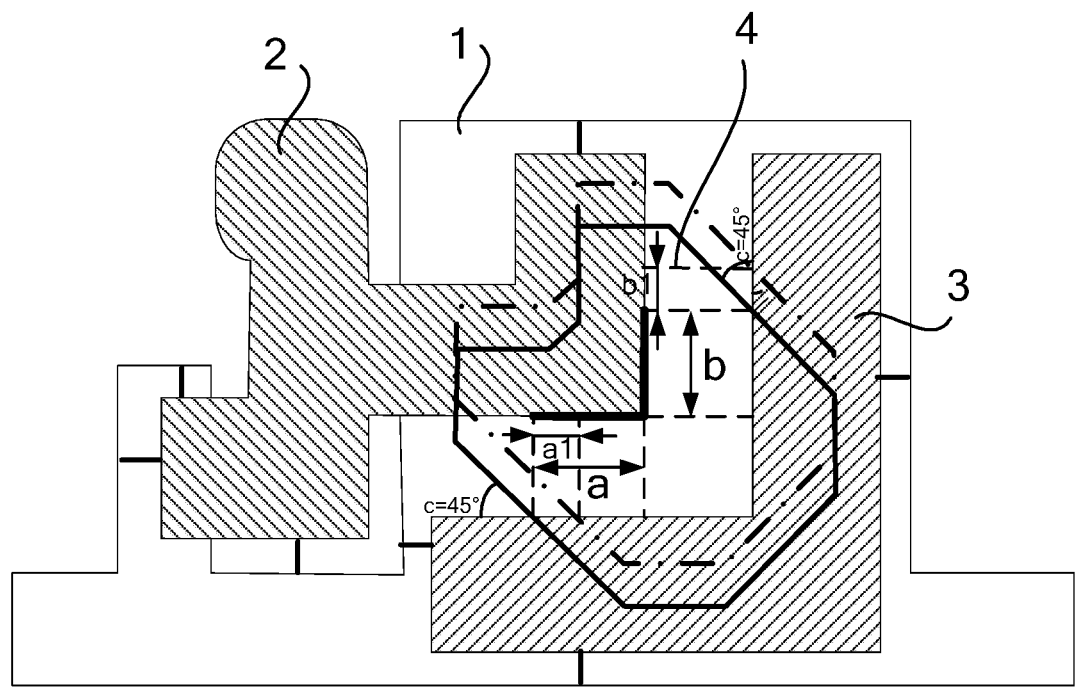

FIG. 3b represents the situation that the active layer shifts leftwards with respect to the correct alignment position, FIG. 3c represents the situation that the active layer shifts downwards with respect to the correct alignment position, and FIG. 3d represents the situation that the active layer shifts upwards with respect to the correct alignment position. By deducing the ratios of width to length of the channel in FIGS. 3b-3c similarly as FIG. 3a, it can be found that the ratio of width to length of the channel is unchanged under the situation of any one of FIGS. 3a-3d.

Since the shift of the active layer in any direction on the plane can be decomposed into a horizontal direction and a vertical direction, in the thin film transistor provided by embodiments of the present disclosure, regardless of which direction the active layer shifts towards, the ratio of the width to the length of the channel is unchanged.

FIGS. 4a-4d are structural schematic diagrams showing that the source 2 and the drain 3 shift with respect to the gate 1 in the thin film transistor provided by embodiments of the present disclosure, wherein the black solid lines represent the correct alignment position of the source 2 and the drain 3, and the broken lines represent the position after the source 2 and the drain 3 have shifted. Taking FIG. 4a as an example, the distance by which the source 2 and the drain 3 shift leftwards with respect to the correct position is f. When the source 2 and the drain 3 do not shift, the width of the channel is a+b. When the source 2 and the drain 3 shift, a is decreased by a1 and b is increased by b1, thus the width of the channel becomes a−a1+b+b1. In the figure, $$a1 = f \qquad (5);$$

$$b1 = f \times \tan 45° = f \qquad (6);$$

it can be obtained from the equations (5) and (6) that a1=b1. That is to say, after the source 2 and the drain 3 have shifted leftwards by the distance f, the width of the channel is still a+b. Therefore, regardless of whether the source 2 and the drain 3 shift leftwards or not, the width of the channel is not changed. Since the length thereof is not changed either, the ratio of width to length of the channel is unchanged.

Figure 4A:
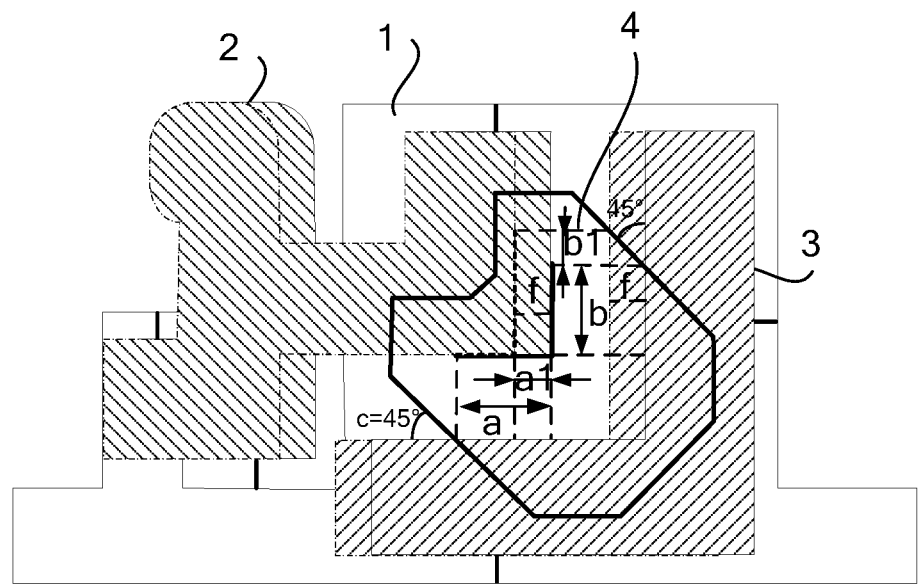
FIGS. 4a-4d are structural schematic diagrams showing that the source and the drain shift with respect to the gate in the thin film transistor provided by embodiments of the present disclosure.
Figure 4B:
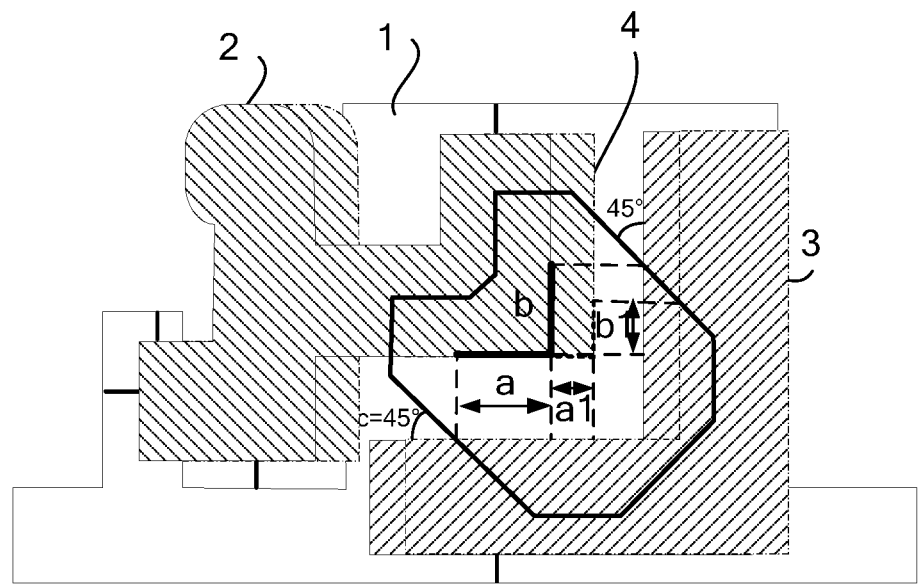
Figure 4C:
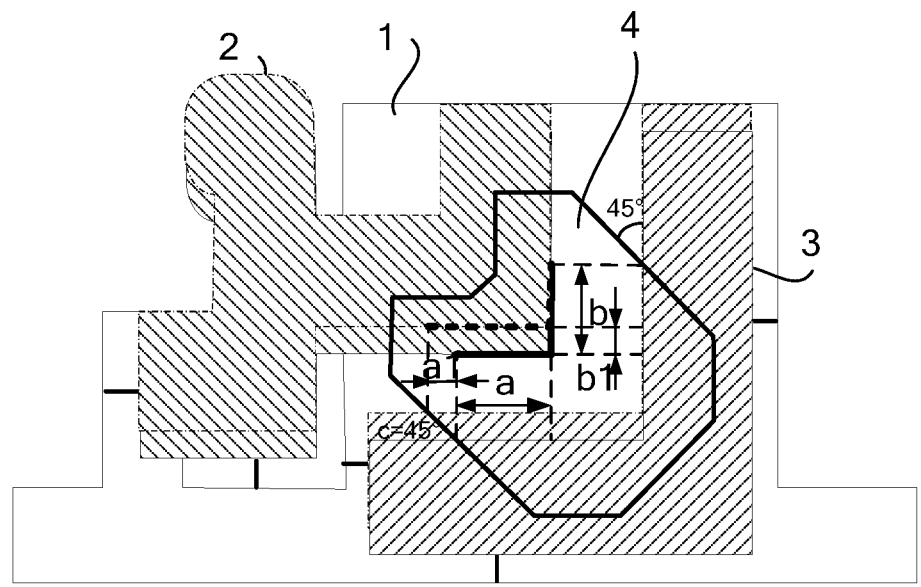
Figure 4D:
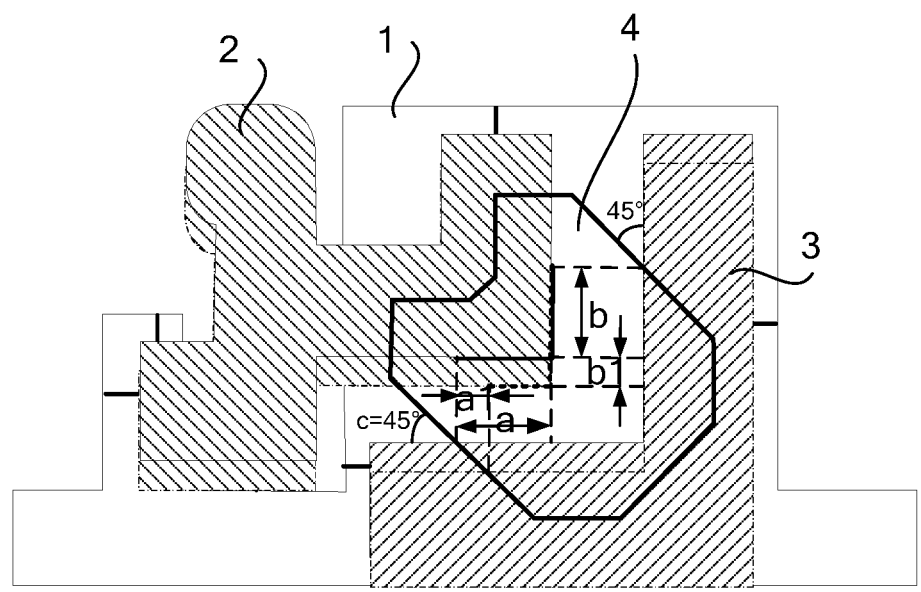

FIG. 4b represents the situation that the source and drain shift rightwards with respect to the correct alignment position, FIG. 4c represents the situation that the source and the drain shift upwards with respect to the correct alignment position, and FIG. 4d represents the situation that the source and the drain shift downwards with respect to the correct alignment position. By deducing the ratios of width to length of the channel in FIGS. 4b-4c similarly as FIG. 4a, it can be found that the ratio of width to length of the channel is unchanged under the situation of any one of FIGS. 4a-4d.

Since the shift of the source and the drain in any direction on the plane can be decomposed into a horizontal direction and a vertical direction, in the thin film transistor provided by embodiments of the present disclosure, regardless of which direction the source and the drain shift towards, the ratio of width to length of the channel is unchanged.

As shown in FIG. 2, the source 2 further comprises a major portion 24, a first extension portion 21 extending from the major portion 24 to the drain 3, a second extension portion 22 extending from the first extension portion 21 to the direction away from the drain 3, and a third extension portion 23 extending from the major portion 24 to the direction away from the drain 3. Moreover, the extending direction of the first extension portion 21 is perpendicular to those of the second extension portion 22 and the third extension portion 23. The arrangement of the first extension portion 21, the second extension portion 22 and the third extension portion 23 enables the capacitance at the position where the gate overlaps the source 2 to be unchanged even in the event that there is alignment deviation between the active layer 4 and the source 2 and/or drain 3, thereby reducing flicker in the displayed picture of the display device.

Further, the drain 3 comprises a first main body 31 arranged in parallel with the second extension portion 22, and a second main body 32 extending from the first main body 31 to the source 2. Moreover, the second main body 32 and the first main body 31 are perpendicular to each other. The first extension portion 21 and the second extension portion 22 are symmetrical to each other with respect to an angular bisector 5 of the angle at the position where the first extension portion 21 joins the second extension portion 22, and the first main body 31 and the second main body 32 are symmetrical with respect to the angular bisector 5.

In a specific embodiment, the active layer 4 further comprises a first connecting side and a second connecting side for connecting the two sides arranged in parallel. Collision-preventing chamfers 41 are formed at the positions where the second connecting side connects the two sides arranged in parallel. The arrangement of the collision-preventing chamfers 41 at the positions where the second connecting side connects the two sides arranged in parallel can prevent occurrence of the phenomenon that the active layer 4 extends beyond the drain 3 when there is alignment deviation between the active layer 4 and the source 2 and drain 3.

Further, collision-preventing chamfers 41' are formed at the positions where the first connecting side connects the two sides arranged in parallel, which can prevent occurrence of the phenomenon that the active layer 4 extends beyond the source 2 when there is alignment deviation between the active layer 4 and the source 2 and drain 3.

Furthermore, the portion of the first connecting side which corresponds to the position where the first extension portion 21 joins the second extension portion 22 is provided with a collision-preventing mouth 42 that protrudes towards the second connecting side.

Alternatively, the source 2 and the drain 3 are arranged in the same layer. Certainly, the source 2 and the drain 3 may also be arranged in different layers.

The present disclosure further provides an array substrate comprising any thin film transistor described above. Since the above thin film transistor can ensure the ratio of width to length of the channel formed upon electrifying to be unchanged and improve the display effect of the display device, the array substrate provided by the present disclosure can improve the display effect of the display device.

The present disclosure further provides a display panel comprising the above array substrate. Since the above array substrate can improve the display effect of the display device, the display panel provided by the present disclosure has good display effect.

The present disclosure further provides a display device comprising the above display panel, which has good display effect.

Obviously, those skilled in the art can make various modifications and variations to the present disclosure without departing from the spirit and scope thereof. In this way, if these modifications and variations to the present disclosure pertain to the scope of the claims of the present disclosure and equivalent technologies thereof, the present invention also intends to encompass these modifications and variations.

The invention claimed is:

1. A thin film transistor, comprising: a gate layer, a source and a drain located on the gate layer, and an active layer located on the source and the drain, the active layer being electrically connected to the source and the drain, wherein the active layer comprises two sides arranged in parallel, and each of the sides forms an acute angle of 45° with a face of the drain facing the source, wherein the active layer further comprises a first connecting side and a second connecting side for connecting the two sides arranged in parallel, collision-preventing chamfers being formed at positions where the second connecting side connects the two sides arranged in parallel and where the first connecting side connects the two sides arranged in parallel.

2. The thin film transistor according to claim 1, wherein the source comprises a major portion, a first extension portion extending from the major portion to the drain, a second extension portion extending from the first extension portion to a direction away from the drain, and a third extension portion extending from the major portion to a direction away from the drain; and an extending direction of the first extension portion is perpendicular to extending directions of the second extension portion and the third extension portion.

3. The thin film transistor according to claim 2, wherein the drain comprises a first main body arranged in parallel with the second extension portion, a second main body extending from the first main body to the source, the second main body and the first main body being perpendicular to each other, the first extension portion and the second extension portion being symmetrical to each other with respect to an angular bisector of an angle at a position where the first extension portion joins the second extension portion, the first main body and the second main body being symmetrical to each other with respect to the angular bisector.

4. The thin film transistor according to claim 2, wherein a portion of the first connecting side which corresponds to a position where the first extension portion joins the second extension portion is provided with a collision-preventing mouth protruding towards the second connecting side.

5. The thin film transistor according to claim 1, wherein the source and the drain are arranged in the same layer.

6. The thin film transistor according to claim 2, wherein the source and the drain are arranged in the same layer.

7. The thin film transistor according to claim 3, wherein the source and the drain are arranged in the same layer.

8. An array substrate comprising a thin film transistor, the thin film transistor comprising: a gate layer, a source and a drain located on the gate layer, and an active layer located on the source and the drain, the active layer being electrically connected to the source and the drain, wherein the active layer comprises two sides arranged in parallel, and each of the sides forms an acute angle of 45° with a face of the drain facing the source, wherein the active layer further comprises a first connecting side and a second connecting side for connecting the two sides arranged in parallel, collision-preventing chamfers being formed at positions where the second connecting side connects the two sides arranged in parallel and where the first connecting side connects the two sides arranged in parallel.

9. The array substrate according to claim 8, wherein the source comprises a major portion, a first extension portion extending from the major portion to the drain, a second extension portion extending from the first extension portion to a direction away from the drain, and a third extension portion extending from the major portion to a direction away from the drain; and an extending direction of the first extension portion is perpendicular to extending directions of the second extension portion and the third extension portion.

10. The array substrate according to claim 9, wherein the drain comprises a first main body arranged in parallel with the second extension portion, a second main body extending from the first main body to the source, the second main body and the first main body being perpendicular to each other, the first extension portion and the second extension portion being symmetrical to each other with respect to an angular bisector of an angle at a position where the first extension portion joins the second extension portion, the first main body and the second main body being symmetrical to each other with respect to the angular bisector.

11. The array substrate according to claim 9, wherein a portion of the first connecting side which corresponds to a position where the first extension portion joins the second extension portion is provided with a collision-preventing mouth protruding towards the second connecting side.

12. The array substrate according to claim 8, wherein the source and the drain are arranged in the same layer.

13. A display panel comprising the array substrate according to claim 8.

14. A display device comprising the display panel according to claim 13.

* * * * *